United States Patent
Hsieh et al.

(10) Patent No.: US 11,594,170 B2
(45) Date of Patent: Feb. 28, 2023

(54) MICRO LIGHT-EMITTING DIODE DISPLAY PANEL, MICRO LIGHT-EMITTING DIODE DISPLAY DEVICE, AND FINGERPRINT IDENTIFICATION METHOD

(71) Applicant: VisEra Technologies Company Limited, Hsin-Chu (TW)

(72) Inventors: Chin-Chuan Hsieh, Hsin-Chu (TW); Hsin-Wei Mao, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 84 days.

(21) Appl. No.: 16/926,902

(22) Filed: Jul. 13, 2020

(65) Prior Publication Data

US 2022/0013061 A1    Jan. 13, 2022

(51) Int. Cl.
  *G09G 3/32*    (2016.01)
  *H01L 33/36*    (2010.01)
  *H01L 33/52*    (2010.01)
  *G06V 40/13*    (2022.01)

(52) U.S. Cl.
  CPC ........... *G09G 3/32* (2013.01); *G06V 40/1318* (2022.01); *H01L 33/36* (2013.01); *H01L 33/52* (2013.01); *G09G 2310/0264* (2013.01)

(58) Field of Classification Search
  CPC ............. G09G 3/32; G09G 2310/0264; G06K 9/0004; H01L 33/52; H01L 33/36
  See application file for complete search history.

(56) References Cited

U.S. PATENT DOCUMENTS

| | | | |
|---|---|---|---|
| 10,157,590 B1* | 12/2018 | Aflatooni | G06V 40/13 |
| 2016/0041663 A1* | 2/2016 | Chen | G06V 40/1318 |
| | | | 345/174 |
| 2018/0357460 A1* | 12/2018 | Smith | H01L 27/3227 |
| 2019/0377858 A1* | 12/2019 | He | G06F 21/32 |
| 2020/0098997 A1* | 3/2020 | Watabe | H01L 51/0072 |
| 2020/0111815 A1 | 4/2020 | Lius et al. | |
| 2020/0133414 A1* | 4/2020 | Lee | G06F 3/044 |

FOREIGN PATENT DOCUMENTS

| | | |
|---|---|---|
| CN | 109686301 A | 4/2019 |
| CN | 111178164 A | 5/2020 |
| JP | 2006-301864 A | 11/2006 |
| JP | 2015-225537 A | 12/2015 |
| TW | M561855 U | 6/2018 |
| TW | 201926666 A | 7/2019 |
| TW | M595259 U | 5/2020 |
| WO | WO-2020053692 A1 | 3/2020 |

OTHER PUBLICATIONS

Office Action and Search Report issued in TW110101928 dated Oct. 19, 2021, 5 pages.
An Office Action dated Nov. 2, 2021 in JP Application No. 2020-183513, 12 pages.
Office Action of its corresponding JP application No. 2020-183513 dated Apr. 19, 2022 with the English translation.

* cited by examiner

*Primary Examiner* — Muhammad N Edun
(74) *Attorney, Agent, or Firm* — Muncy, Geissler, Olds & Lowe, P.C.

(57) ABSTRACT

A micro light-emitting diode (LED) display panel is provided. The micro LED display panel includes a substrate and a driving layer. The driving layer is disposed on the substrate. The driving layer includes a micro LED and a photo sensor. When the micro LED emits light to a finger of a user, the photo sensor generates a sensing signal.

12 Claims, 9 Drawing Sheets

MICRO LIGHT-EMITTING DIODE DISPLAY PANEL, MICRO LIGHT-EMITTING DIODE DISPLAY DEVICE, AND FINGERPRINT IDENTIFICATION METHOD

BACKGROUND OF THE INVENTION

Field of the Invention

The invention relates to a micro light-emitting diode (LED) display device, and more particularly to a micro LED display device with fingerprint detection.

Description of the Related Art

With development of portable electronic apparatuses and electronic transaction, personal identification and personal information security become more important. Since a human fingerprint has uniqueness and invariance, fingerprint identification technology provides fine safety and high reliability. In conventional electronic apparatuses with the fingerprint identification function, there is a specific panel for fingerprint detection. The disposition of the specific panel increases the size of the electronic apparatuses. Moreover, the specific panel cannot serve as an input interface. In other some conventional electronic apparatuses with the fingerprint identification function, an optoelectronic sensing panel is disposed over a display panel. However, the light emitted from the display panel may be blocked by the optoelectronic sensing panel, which results in low brightness of the display panel.

BRIEF SUMMARY OF THE INVENTION

An exemplary embodiment of a micro light-emitting diode (LED) display panel is provided. The micro LED display panel comprises a substrate and a driving layer. The driving layer is disposed on the substrate. The driving layer comprises a micro LED and a photo sensor. When the micro LED emits light to a finger of a user, the photo sensor generates a sensing signal.

An exemplary embodiment of a micro light-emitting diode (LED) display device is provided. The micro LED display device comprises a first gate driver, a source driver, a second gate driver, a micro LED display panel, a readout circuit, and a controller. The first gate driver is configured to provide a plurality of first driving signals. The source driver is configured to provide a plurality of display signals. The second gate driver is configured to provide a plurality of second driving signals. The micro LED display panel is controlled by the plurality of first driving signals, the plurality of displaying signals, and the plurality of second driving signal. The micro LED display panel comprises a substrate and a driving layer. The driving layer is disposed on the substrate. The driving layer comprises a plurality of cells. Each cell receives one of the plurality of first driving signals, one of the plurality of display signals, and one of the plurality of second driving signals. Each cell comprises a micro LED and a photo sensor The photo sensor is configured to detect light and generate a sensing signal according to the detect light. The readout circuit is coupled to the micro LED display panel and configured to generate an output signal according to the sensing signals. The controller is configured to control the first gate driver, the source driver, and the second gate driver and perform a fingerprint determination operation according to the output signal. When at least one of the micro LED emits light to a finger of a user, at least one of photo sensors generates the corresponding sensing signal according to reflected light from the finger, and the controller performs the fingerprint determination operation according to the output signal to detect a fingerprint of the finger.

An exemplary embodiment of a fingerprint identification method for a micro light-emitting diode (LED) display panel is provided. The micro LED display panel comprises a plurality of cells, and each cell comprises a micro LED. The fingerprint identification method comprises the steps: obtaining a position of a finger on the micro LED display panel in response to the finger approaching a region of the micro LED display panel; driving the micro LEDs of the cells in the region of the micro LED display panel to emit light; obtaining a fingerprint of the finger in response to light emitted by the micro LEDs; and determining whether the obtained fingerprint matches a predetermined pattern.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
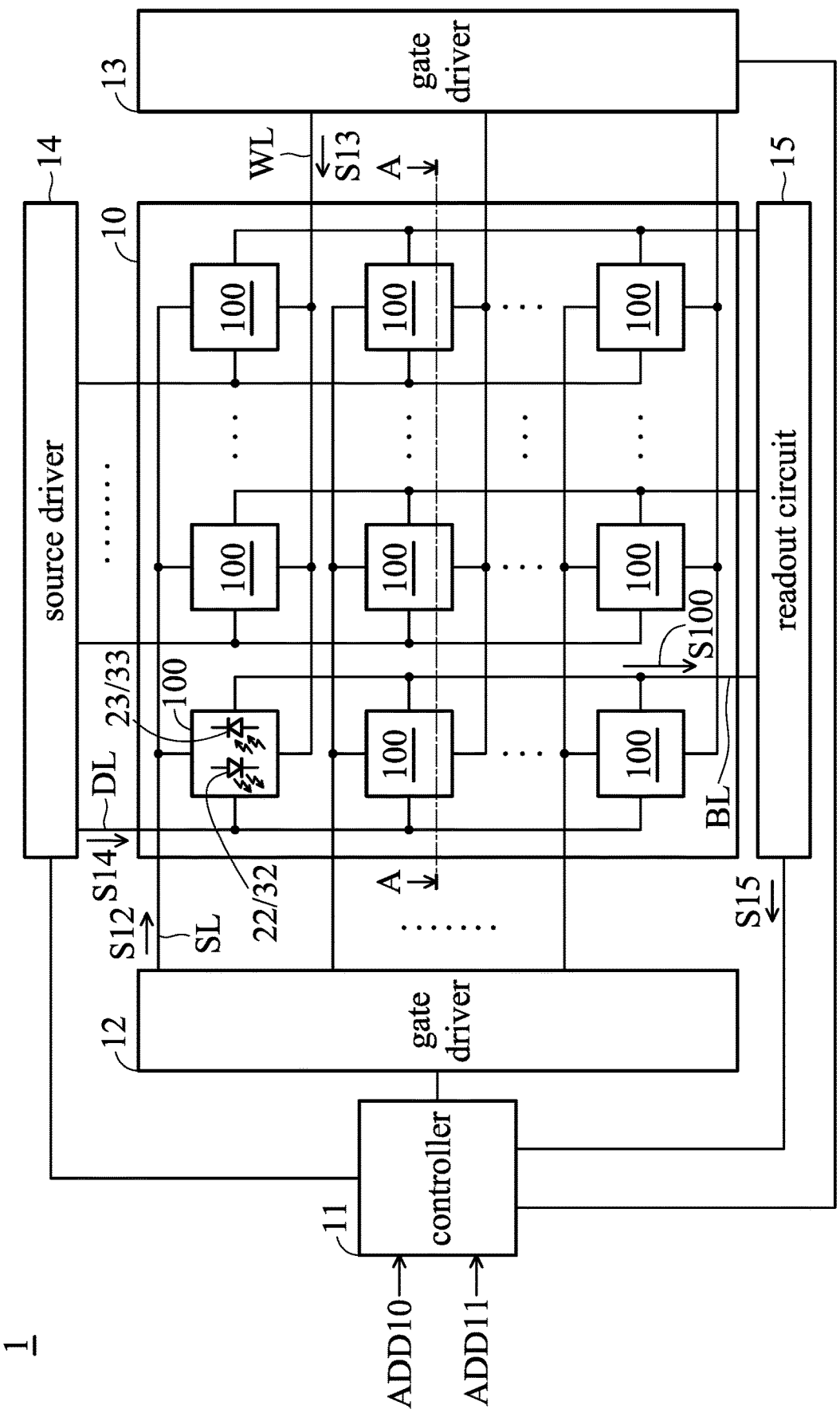
FIG. 1 shows an exemplary embodiment of a micro light-emitting diode (LED) display device.

FIG. 1 shows an exemplary embodiment of a micro light-emitting diode (LED) display device. As shown in FIG. 1, a micro LED display device 1 comprises a micro LED display panel 10, a controller 11, gate drivers 12 and 13, a source driver 14, and a readout circuit 15. The micro LED display panel 10 comprises a plurality of cells 100 which are disposed on rows and columns to form an array. Each cell 100 comprises a micro LED (such as a micro LED 22 shown in FIG. 2 or a micro LED 32 shown in FIG. 3) and a photo sensor (such as a photo sensor 23 shown in FIG. 2 or a photo sensor 33 shown in FIG. 3). The gate driver 12 provides driving signals S12 to the micro LED display panel 10 through scan lines SL, respectively, and the cells on the same row are coupled to the same scan line SL. The source driver 14 provides display signals S14 through data lines DL, respectively, and the cells on the same column are coupled to the same data line DL. The gate driver 13 provides driving signal S13 to the micro LED display panel 10 through word lines WL, respectively, and the cells on the same row are coupled to the same word line WL. The readout circuit 15 is coupled to the micro LED display panel 10 through bit lines BL, and the cells on the same column are coupled to the same bit line. The controller 11 controls the gate driver 12 and the source driver 14 according to an address signal ADD10 to determine the timing of the driving signals S12 and the timing of the display signals S14. The controller 11 also controls the gate driver 13 according to an address signal ADD11 to determine the timing of the driving signals S13. The readout circuit 15 receives sensing signals S100 generated by the cells 100 through the bit lines BL and generates an output signal S15 according to the received sensing signals S100. One sensing signal indicates the level of the light sensed by the corresponding cell. The readout circuit 15 transmits the output signal S15 to the controller 11. The controller 11 may performs a fingerprint determination operation or a touch determination operation according to the output signal S15.

Figure 2:
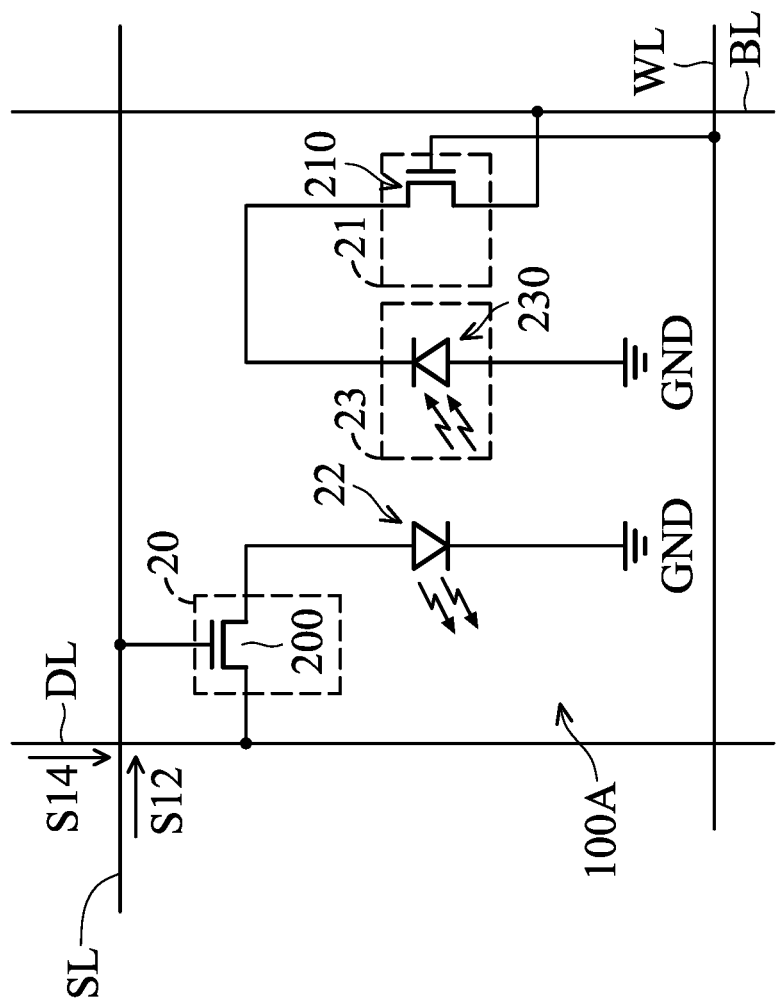
FIG. 2 shows one exemplary embodiment of a circuit structure of a cell.

FIG. 2 shows one exemplary embodiment of a circuit structure of a cell. According to the embodiment, each of the cells 100 of FIG. 1 has the circuit structure of the cell 100A shown in FIG. 2. Referring to FIG. 2, the cell 100A comprises switches 20 and 21, a micro LED 22, and a photo sensor 23. In the embodiment, the photo sensor 23 is implemented by a photo diode 230. The switch 20 comprises a transistor 200. The gate electrode of the transistor 200 is coupled to the corresponding scan line SL, the input electrode (source or drain) thereof is coupled to the corresponding data line DL, and the output terminal (drain or source) thereof is coupled to the anode of the micro LED 22. The cathode of the micro LED 22 is coupled to a ground GND. The switch 21 comprises a transistor 210. The gate electrode of the transistor 210 is coupled to the corresponding word line WL, the input electrode (source or drain) thereof is coupled to the cathode of the photo diode 23, and the output electrode (drain or source) thereof is coupled to the corresponding bit line BL. The anode of the photo diode 23 is coupled to the ground GND.

Figure 3:
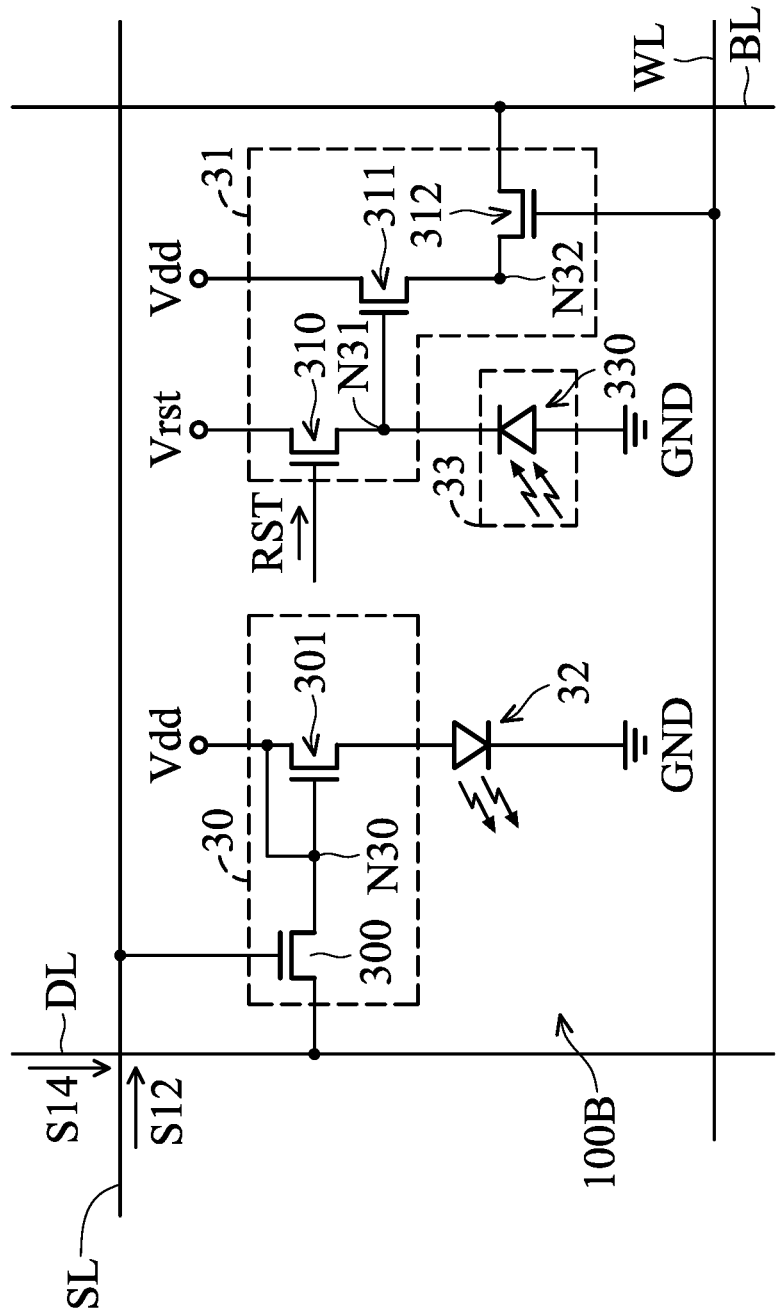
FIG. 3 shows another exemplary embodiment of the circuit structure of a cell.

FIG. 3 shows another exemplary embodiment of the circuit structure of a cell. According to the embodiment, each of the cells 100 of FIG. 1 has the circuit structure of the cell 100B shown in FIG. 3. Referring to FIG. 3, the cell 100B comprises switches 30 and 31, a micro LED 32, and a photo sensor 33. In the embodiment, the photo sensor 33 is implemented by a photo diode 330. The switch 30 comprises transistors 300 and 301. The gate electrode of the transistor 300 is coupled to the corresponding scan line SL, the input electrode (source or drain) thereof is coupled to the corresponding data line DL, and the output terminal (drain or source) thereof is coupled to a node N30. The gate electrode of the transistor 301 is coupled to the node N30, the input electrode (source or drain) thereof is coupled to the node N30 and a supply power Vdd, and the output terminal (drain or source) thereof is coupled to the anode of the micro LED 32. The cathode of the micro LED 32 is coupled to a ground GND. The switch 31 comprises transistors 310-312. The gate electrode of the transistor 310 receives a reset signal RST, the input electrode (source or drain) thereof receives a reset voltage Vrst, and the output electrode (drain or source) thereof is coupled to the cathode of the photo diode 330 at a floating node N31. The anode of the photo diode 330 is coupled to the ground GND. The gate electrode of the transistor 311 is coupled to the floating node N31, the input electrode (source or drain) thereof is coupled to the supply power Vdd, and the output electrode (drain or source) thereof is coupled to a node N32. The gate electrode of the transistor 312 is coupled to the corresponding word line WL, the input electrode (source or drain) thereof is coupled to the node N32, and the output electrode (drain or source) thereof is coupled to the corresponding bit line BL.

According to the above embodiments, when the micro LED 22/32 of a cell emits light to a finger of a user, the photo sensor 23/33 of the cell senses the reflected light from the finger, and a corresponding sensing signal S100 is generated through the operations of the photo sensor 23/33 and the switch 21/31 according to the reflected light. Thus, when several cells emits light to the finger, the sensing signals S100 generated by these cells in response to the respective reflected light from the finger can indicate the fingerprint of the finger. The readout circuit 15 generates the output signal S15 according the sensing signals S100 from the cells, and the controller 11 performs the fingerprint determination operation according to the output signal S15 to determinate the fingerprint of the finger and identifying the fingerprint.

Figure 4A:
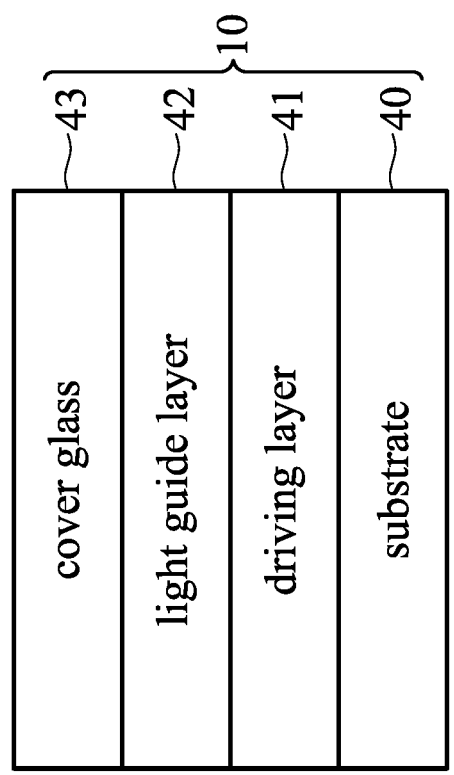
FIG. 4A shows a sectional drawing of an exemplary embodiment of a micro LED display panel.

FIG. 4A shows a sectional drawing of an exemplary embodiment of the micro LED display panel 10 along a section line A-A shown in FIG. 1. As shown in FIG. 4A, the LED display panel 10 comprises a substrate 40, a driving layer 41, a light guide layer 42, and a cover glass 43. The substrate 40 is provided for the micro LED display panel 10. The driving layer 41 is formed on the substrate 40. For the embodiment of FIG. 2, the switches 20 and 21, the micro LED 22, and the photo sensor 23 of each cell 100 are formed in the driving layer 41. For the embodiment of FIG. 3, the switches 30 and 31, the micro LED 32, and the photo sensor 33 of each cell 100 are formed in the driving layer 41. The light guide layer 42 is formed on the driving layer 41. The light guide layer 42 comprises a plurality of light guide plates 420, and each light guide plate overlaps the photo sensor of one cell. The cover glass 43 is formed on the light guide layer 42. When the micro LED display device 1 operates, a touch pen or finger(s) of a user may touch or contact the outer side of the cover glass 43 for the touch determination operation or the fingerprint determination operation.

Figure 5:
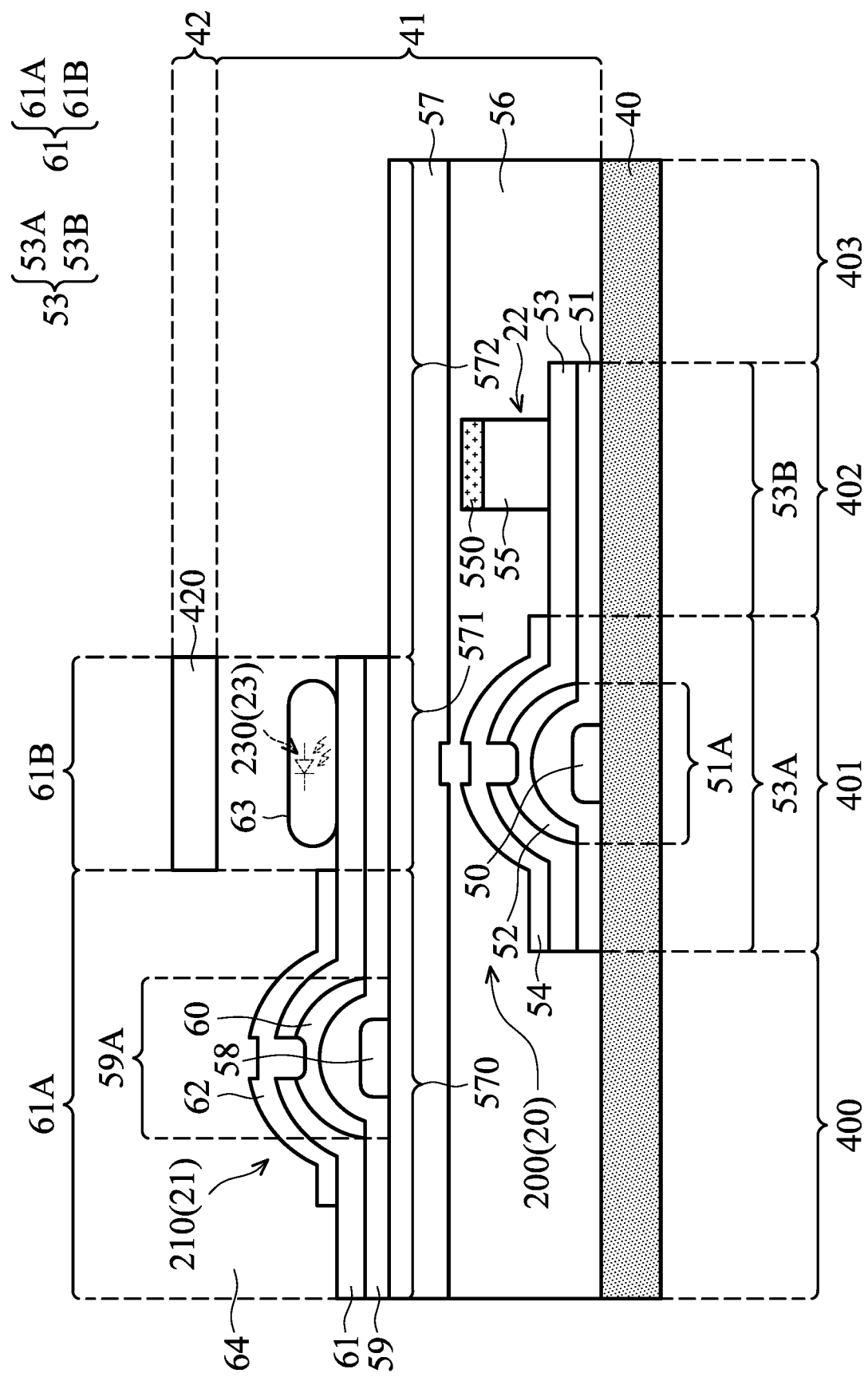
FIG. 5 shows a sectional drawing of one exemplary embodiment of a driving layer of a micro LED panel.

FIG. 5 shows a sectional drawing of one exemplary embodiment of the driving layer 41 of the micro LED display panel 10. In order to illustrate the driving layer 41, FIG. 5 also show the substrate 40 and the light guide layer 42. Moreover, FIG. 5 only shows the sectional drawing of the driving layer 41 for one cell 100. The sectional drawings of the other cells are the same as the sectional drawing shown in FIG. 5. Referring to FIG. 5, a metal layer 50 is formed on the substrate 40. In the embodiment, the substrate 40 is divided to regions 400-403. A gate insulation layer 51 is formed on the substrate 40. A portion 51A of the gate insulation layer 51 covers the metal layer 50. An active layer 52 is formed on the portion 51A of the gate insulation layer 51. An electrode layer 53 is formed on a portion of the gate insulation layer 51 which contacts the substrate 40 and further on the active layer 52. The electrode layer 53 comprises two portions 53A and 53B which correspond to the regions 401 and 402 of the substrate 40 respectively. Referring to FIG. 5, the portion 53A of the electrode layer 53 covers the active layer 52. An insulation layer 54 is formed on the portion 53A of the electrode layer 53. A semiconductor layer 55 is formed the portion 53B of the electrode layer 53. Then, a planarization layer 56 is formed on the substrate 40 and covers the portion 53B of the electrode layer 53, the insulation layer 54, and the semiconductor layer 55.

Referring to FIG. 5, a transparent film 57 is formed on a planar side of the planarization layer 56. In the embodiment, the transparent film 57 is divided to regions 570-572. A metal layer 58 is formed on the transparent film 57. A gate insulation layer 59 is formed on the transparent film 57. A portion 59A of the gate insulation layer 59 covers the metal layer 58. An active layer 60 is formed on the portion 59A of the gate insulation layer 59. An electrode layer 61 is formed on a portion of the gate insulation layer 59 which contacts the planarization layer 56 and further on the active layer 60. The electrode layer 61 comprises two portions 61A and 61B which correspond to the regions 570 and 571 of the transparent film 57 respectively. Referring to FIG. 5, the portion 61A of the electrode layer 61 covers the active layer 60. An insulation layer 62 is formed on the portion 61A of the electrode layer 61. A semiconductor layer 63 is formed the portion 61B of the electrode layer 61. Then, a planarization layer 64 is formed on the planarization layer 56 and covers the electrode layer 61, the insulation layer 62, and the semiconductor layer 63. A light guide plant 420 in the light guide layer 42 overlaps the semiconductor layer 63.

For the embodiment of FIG. 2, the micro LED 22 comprises a light-emitting layer 550 which is formed on the semiconductor layer 55, and the metal layer 50, the active layer 52, and the portion 53A of the electrode layer 53 forms the transistor 200 of the switch 20 which is coupled to the micro LED 22. The semiconductor layer 63 comprises the photo diode 230 of the photo sensor 23. The metal layer 58, the active layer 60, and the portion 61A of the electrode layer 61 forms the transistor 210 of the switch 21. Referring FIG. 5, according to the disposition between of the light guide plant 420 and the semiconductor layer 63 in each cell, the light entering the micro LED display panel 10 can be guided to the photo diode 230 through the light guide plant 420.

Figure 6:
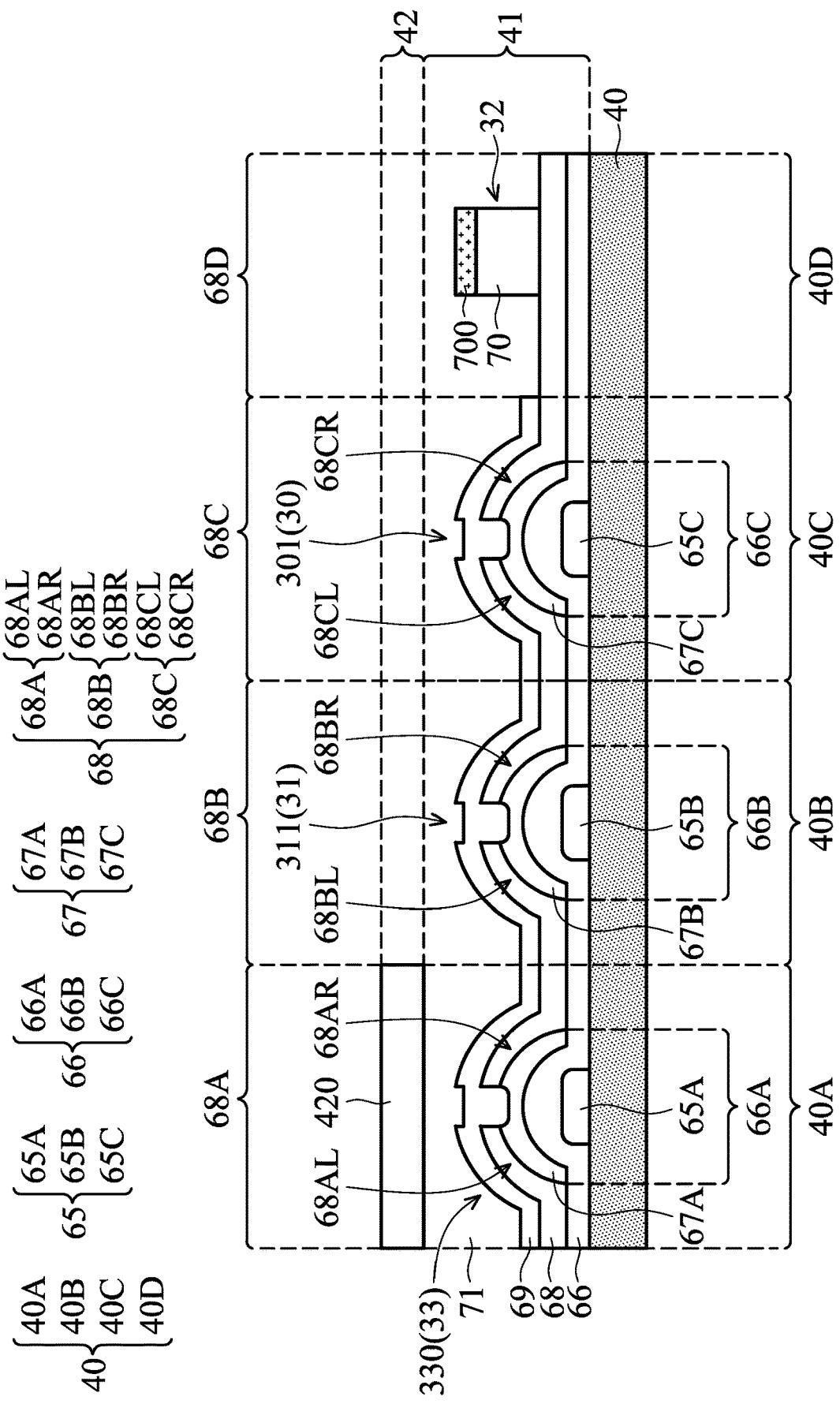
FIG. 6 shows a sectional drawing of another exemplary embodiment of a driving layer of a micro LED panel.

FIG. 6 shows a sectional drawing of another exemplary embodiment of the driving layer 41 of the micro LED display panel 10. In order to illustrate the driving layer 41, FIG. 6 also show the substrate 40 and the cover glass 42. Moreover, FIG. 6 only shows the sectional drawing of the driving layer 41 for one cell 100. The sectional drawings of the other cells are the same as the sectional drawing shown in FIG. 6. In the embodiment, the substrate 40 is divided to four portions 40A-40D. Referring to FIG. 6, a metal layer 65 is formed on the substrate 40. The metal layer 65 comprises three portions 65A, 65B, and 65C which correspond to the regions 40A, 40B, and 40C of the substrate 40 respectively. A gate insulation layer 66 is formed on the substrate 40. The gate insulation layer 66 comprises several portions including portions 66A, 66B, and 66C which correspond to the regions 40A, 40B, and 40C of the substrate 40 respectively. The portion 66A of the gate insulation layer 66 covers the portion 65A of the metal layer 65. The portion 66B of the gate insulation layer 66 covers the portion 65B of the metal layer 65. The portion 66C of the gate insulation layer 66 covers the portion 65C of the metal layer 65. An active layer 67 is formed on the gate insulation layer 66. In details, a portion 67A of the active layer 67 is formed on the portion 66A of the gate insulation layer 66, a portion 67B of the active layer 67 is formed on the portion 66B of the gate insulation layer 66, and a portion 67C of the active layer 67 is formed on the portion 66C of the gate insulation layer 66. An electrode layer 68 is formed on a portion of the gate insulation layer 66 which contacts the substrate 40 and further on the active layer 67. Referring to FIG. 6, a portion 68A of the electrode layer 68 covers the portion 67A of the active layer 67, a portion 68B of the electrode layer 68 covers the portion 67B of the active layer 67, and a portion 68C of the electrode layer 68 covers the portion 67C of the active layer 67. An insulation layer 69 is formed on the portions 68A, 68B, and 68C of the electrode layer 68. A semiconductor layer 70 is formed a portion 68D of the electrode layer 68. A planarization layer 71 is formed on the substrate 40 and covers the portion 68D of the electrode layer 68, the insulation layer 69, and the semiconductor layer 70.

The portion 68A of the electrode layer 68 is divided into two sections 68AL and 68AR which are isolated from each other. The portion 68B of the electrode layer 68 is divided into sections 68BL and 68BR which are isolated from each other. The portion 68C of the electrode layer 68 is divided into two sections 68CL and 68CR which are isolated from each other. The section 68BL is connected with the section 68AR. The section 68CL is connected with the section 68BR. The section 68CR is connected with the portion 68D of the electrode layer 68.

For the embodiment of FIG. 3, the micro LED 32 comprises a light-emitting layer 700 which is formed on the semiconductor layer 70, and the portion 65C of the metal layer 65, the portion 67C of the active layer 67, and the portion 68C of the electrode layer 68 form the transistor 301 of the switch 30 which is coupled to the micro LED 32. The portion 65A of the metal layer 65, the portion 66A of the gate insulation layer 66, the portion 67A of the active layer 67, and the portion 68A of the electrode layer 68 form the photo diode 330 of the photo sensor 30 through connecting the portion 65A of the metal layer 65 with the section 68AL of the portion 68A of the electrode 68 by a metal line. The portion 65B of the metal layer 65, the portion 67B of the active layer 67, and the portion 68B of the electrode layer 68 form the transistor 311 of the switch 31. Referring FIG. 6, according to the disposition of the light guide plant 420 in each cell, the light entering the micro LED display panel 10 can be guided to the photo diode 330 through the light guide plant 420.

Figure 7:
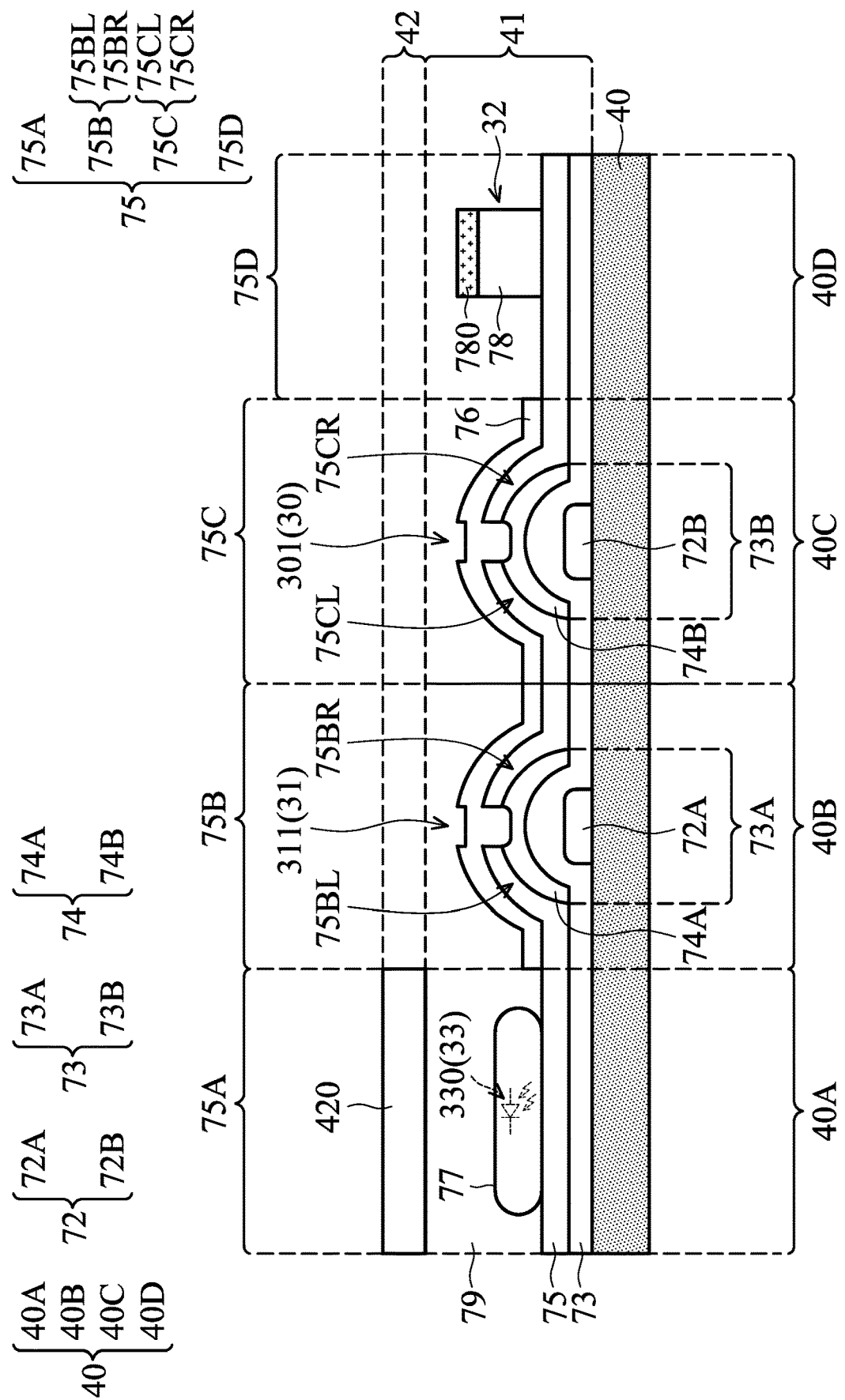
FIG. 7 shows a sectional drawing of another exemplary embodiment of a driving layer of a micro LED panel.

FIG. 7 shows a sectional drawing of another exemplary embodiment of the driving layer 41 of the micro LED display panel 10. In order to illustrate the driving layer 41, FIG. 7 also show the substrate 40 and the cover glass 42. Moreover, FIG. 7 only shows the sectional drawing of the driving layer 41 for one cell 100. The sectional drawings of the other cells are the same as the sectional drawing shown in FIG. 7. In the embodiment, the substrate 40 is divided to four portions 40A-40D. Referring to FIG. 7, a metal layer 72 is formed on the structure 40. The metal layer 72 comprises two portions 72A and 72B which correspond to the regions 40B and 40C of the substrate 40 respectively. A gate insulation layer 73 is formed on the substrate 40. The gate insulation layer 73 comprises several portions including portions 73A and 73B which correspond to the regions 40B and 40C of the substrate 40 respectively. The portion 73A of the gate insulation layer 73 covers the portion 72A of the metal layer 72. The portion 73B of the gate insulation layer 73 covers the portion 72B of the metal layer 72. An active layer 74 is formed on the gate insulation layer 73. In details, a portion 74A of the active layer 74 is formed on the portion 73A of the gate insulation layer 73, and a portion 74B of the active layer 74 is formed on the portion 73B of the gate insulation layer 73. An electrode layer 75 is formed on a portion of the gate insulation layer 73 which contacts the substrate 40 and further on the active layer 74. Referring to FIG. 7, a portion 75B of the electrode layer 75 covers the portion 74A of the active layer 74, and a portion 75C of the electrode layer 75 covers the portion 74B of the active layer 74. An insulation layer 76 is formed on the portions 75B and 75C of the electrode layer 75. A semiconductor layer 77 is formed on a portion 75A of the electrode layer 75. A semiconductor layer 78 is formed a portion 75D of the electrode layer 75. A planarization layer 79 is formed on the substrate 40 and covers the portions 75A and 75D of the electrode layer 75, the insulation layer 76, and the semiconductor layers 77 and 78.

The portion 75B of the electrode layer 75 is divided into two sections 75BL and 75BR which are isolated from each other. The portion 75C of the electrode layer 75 is divided into sections 75CL and 75CR which are isolated from each other. The section 75BL is connected with the portion 75A of the electrode layer 75. The section 75CL is connected with the section 75BR. The section 75CR is connected with the portion 75D of the electrode layer 75.

For the embodiment of FIG. 3, the micro LED 32 comprises a light-emitting layer 780 which is formed on the semiconductor layer 78, and the portion 72B of the metal layer 72, the portion 74B of the active layer 74, and the portion 75C of the electrode layer 75 form the transistor 301 of the of the switch 30 which is coupled to the micro LED 32. The semiconductor layer 77 comprises the photo diode 330. The portion 72A of the metal layer 72, the portion 74A of the active layer 74, and the portion 75B of the electrode layer 75 form the transistor 311 of the switch 31. Referring FIG. 7, according to the disposition of the light guide plant 420 in each cell, the light entering the micro LED display panel 10 can be guided to the photo diode 330 through the light guide plant 420.

According to the above embodiments, micro LEDs, switches for the micro LEDs, photo sensors, and switches for the photo sensors are formed on the same substrate. In order words, the micro LED display panel 10 provided by the embodiment comprises micro LEDs, switches for the micro LEDs, photo sensors, and switches for the photo sensors which are formed on the same substrate 40. Since the size of the micro LEDs is small, the micro LED display panel 10 can serve as not only a touch panel for detecting touch input events but also an identification panel for detecting fingerprints. Moreover, the micro LED display panel 10 provides multi-fingers identification due to the operations of the gate driver 14 and the readout circuit 15.

Figure 4B:
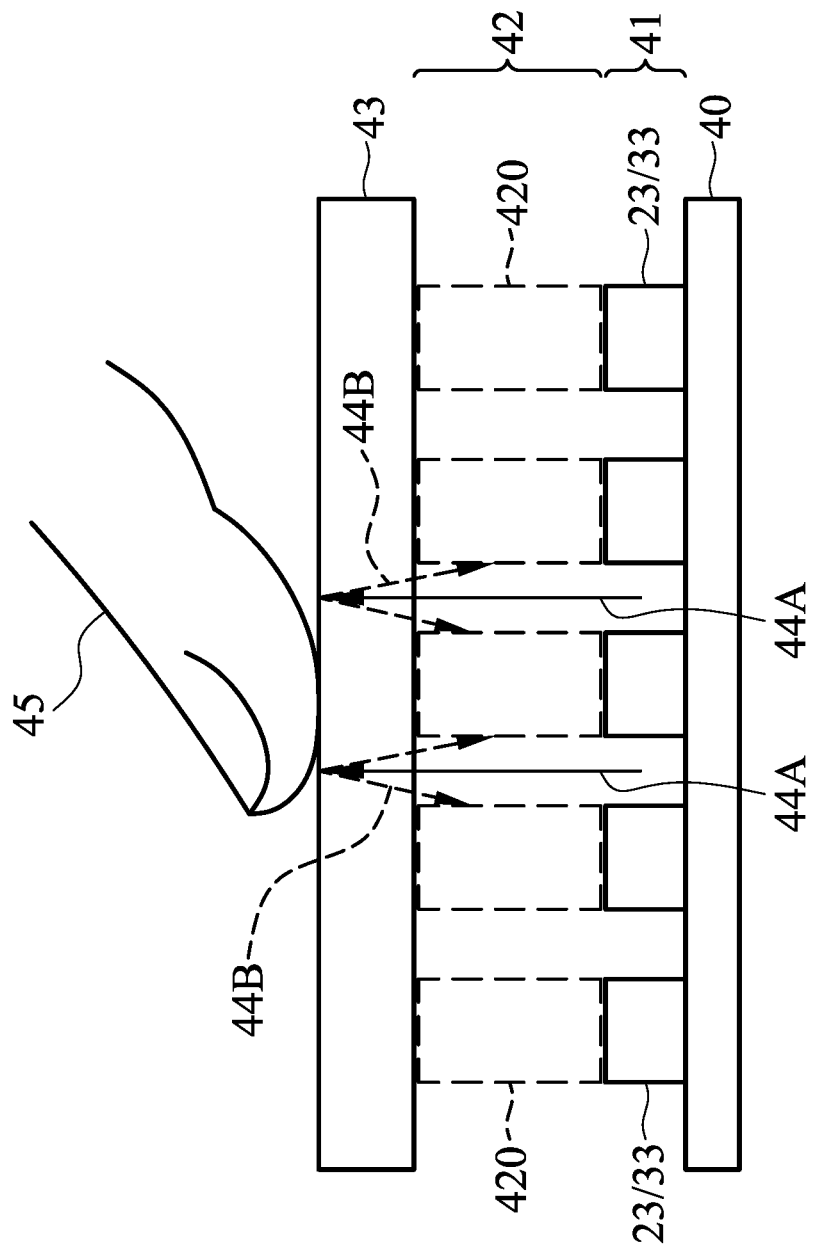
FIG. 4B is a schematic diagram showing light guide plants on a light guide layer according to an exemplary embodiment.

In the above embodiments, there are light guide plants 420 formed in the light guide layer 42, as shown in FIG. 4B. In order to clearly show the locations of the light guide plants, FIG. 4B also shows photo sensors 23/33 of the cells 100A/100B and the cover glass 43, wherein five photo sensors 23/33 and five light guide plants 420 are shown for the illustration. In FIG. 4B, the photo sensors may comprise the photo diodes 230 of FIG. 2 formed in the semiconductor layers 63 of FIG. 5, the photo diodes 330 of FIG. 3 formed in the region 40A of FIG. 6, or the photo diodes 330 of FIG. 3 formed in the semiconductor layer 77 of FIG. 7. Referring to FIGS. 4B and 5-7, the light guide plants 420 are disposed above the photo diodes, respectively. In other words, each light guide plant 420 is disposed above one photo diode, so that the light guide plant 420 can guides the light entering the micro LED display panel 10 to the corresponding photo diode. For example, when the micro LEDs 22/32 emit light 44A to a finger 45 of a user, the reflected light 44B from the finger 45 is guided to the photo diodes through the corresponding light guide plants 420.

Figure 8:
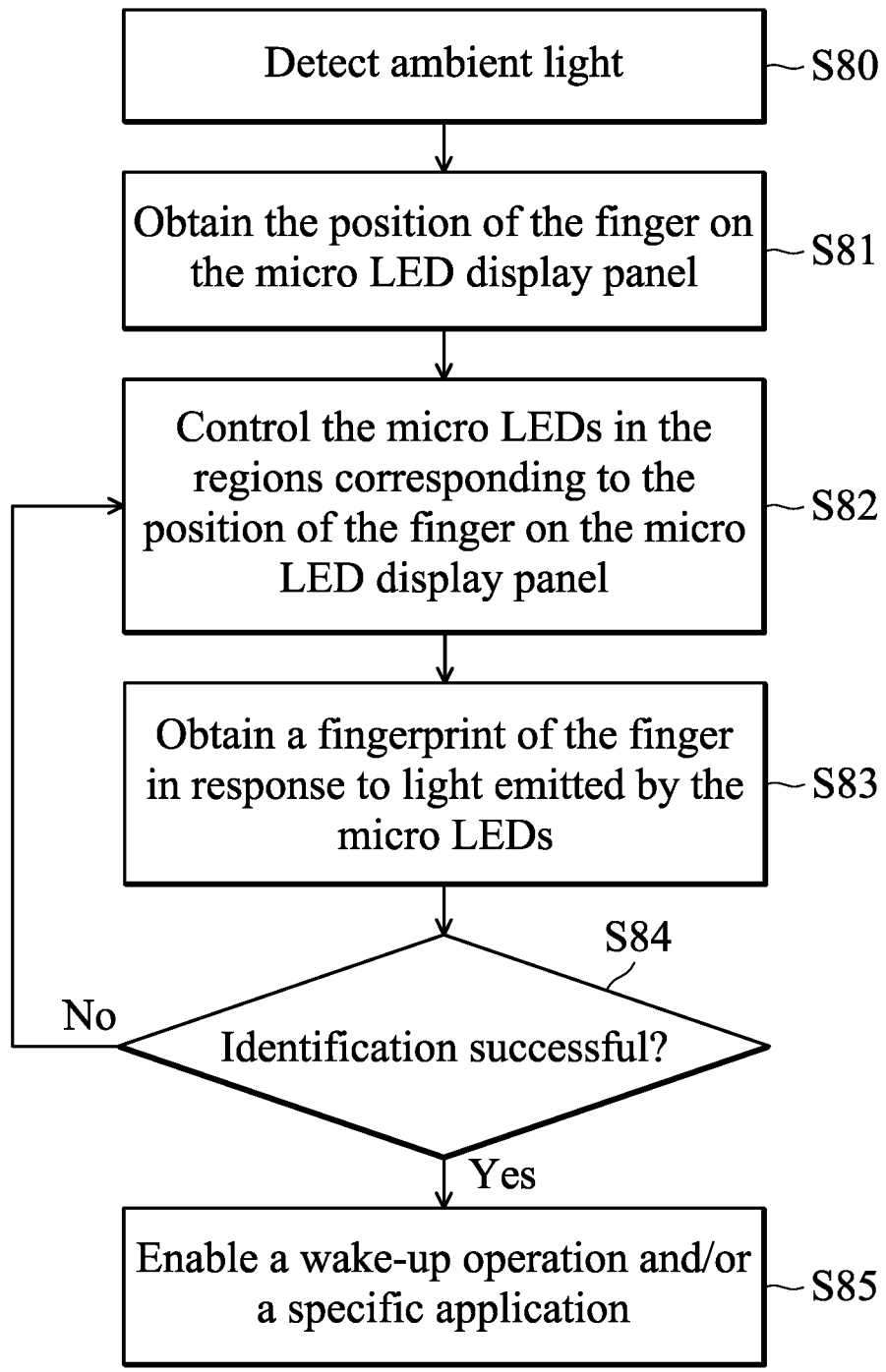
FIG. 8 shows a flow chart of an exemplary embodiment of a fingerprint identification method.

FIG. 8 shows a flow chart of an exemplary embodiment of a fingerprint identification method. The fingerprint identification method will be described by taking the cells with the circuit structure shown in FIG. 2. Referring to FIG. 8, when the electronic apparatus which the micro LED display device 1 is applied for is a standby mode, the micro LEDs 22 of all the cells do not emit light, and the photo sensors 23 operate to detect the ambient light of the micro LED display device 1 and generate the corresponding sensing signals S100 in response to the detected ambient light (step S80). In the standby mode, when a finger of a user is approaching the micro LED display panel 10, the light detected by the photo sensors in the region of the micro LED display panel 10 which is close to the finger is less. Accordingly, the controller 11 can determine whether which region of the micro LED display panel 10 is emitted by less light according to the output signal S15 derived from the sensing signal S100 to obtain the position of the finger on the micro LED display panel 10 (step S81). After the position of the finger is obtained, the controller 11 controls the gate driver 12 and the source driver 14 to drive the micro LEDs 22 in the determined regions of the micro LED display panel 10 to emit light (step S82). The reflected light from the finger is transmitted to at least one photo sensor 23, and the output signal S15 is generated in response to the reflected light. Then, the controller 11 obtains the fingerprint of the finger according to the output signal S15 from the readout circuit 15 (step S83). In other words, the controller 11 obtains the fingerprint of the finger in response to the light emitted by the micro LEDs 22. The controller 11 further performs the fingerprint determination operation according to the output signal S15 to determine whether the obtained fingerprint matches a predetermined pattern thereby identifying the user (step S84). If the controller 11 determines that the detected fingerprint matches the predetermined pattern, the identification is successful, and the controller 11 performs a specific function, for example, the controller 11 enables a wake-up operation for the electronic apparatus and/or enable a specific application of the electronic apparatus (step S85). If the controller 11 determines that the detected fingerprint does not match the predetermined pattern, the identification is not successful, and the method proceeds back to the step S81. In the embodiment, the electronic apparatus can be a mobile phone, a laptop, a tablet, a digital camera, or any electronic apparatus with identification function. The ambient light detected in the step S80 can serve as a base line for the output signal S15 generated during the normal touch determination operation, so that the touch determination may not be affected by the ambient light of the micro LED display device 1, thereby enhancing the accuracy of the touch determination.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro light-emitting diode display panel comprising:
   a common substrate; and
   a driving layer, wherein the driving layer comprises:
   a micro LED disposed on the common substrate; and
   a photo sensor disposed on the common substrate,
   wherein the photo sensor operates to detect ambient light of the micro light-emitting diode display panel,
   wherein when the micro LED is driven according to the detected ambient light, the micro LED emits light to a finger of a user, and the photo sensor senses reflected light from the finger to generate a sensing signal, wherein the micro LED comprises a light-emitting layer which is formed on a first semiconductor layer, wherein the photo sensor is formed in a second semiconductor layer, and the second semiconductor layer is formed above the first semiconductor layer, and wherein the first semiconductor layer is proximate from the common substrate, and the second semiconductor layer is distal from the common substrate.

2. The micro LED display device as claimed in claim 1, further comprising:

a cover glass disposed on the driving layer;

a light guide layer disposed between the cover glass and the driving layer, wherein the light guide layer comprises a light guide plate which is disposed above the photo sensor.

3. The micro LED display panel as claimed in claim 1, wherein the driving layer further comprises:

a first transistor configured to transmit a display signal to the micro LED, wherein the first transistor comprises a metal layer, a gate insulation layer, an active layer, a first electrode layer, and wherein the first semiconductor layer is formed on the first electrode layer.

4. The micro LED display panel as claimed in claim 3, wherein the driving layer further comprises:

a transparent film formed above the micro LED and the first transistor; and a second transistor formed on the transparent film and coupled to the photo sensor, wherein the second transistor comprises a metal layer, a gate insulation layer, an active layer, a second electrode layer, wherein the second semiconductor layer is formed on the second electrode layer.

5. The micro LED display device as claimed in claim 1, wherein the micro LED is configured to receive a display signal and emit light according to the display signal.

6. A micro light-emitting diode display device comprising:

a first gate driver configured to provide a plurality of first driving signals;

a source driver configured to provide a plurality of display signals;

a second gate driver configured to provide a plurality of second driving signals;

a micro LED display panel controlled by the plurality of first driving signals, the plurality of display signals, and the plurality of second driving signals, wherein the micro LED display panel comprises:

a common substrate; and a driving layer, comprising a plurality of cells, wherein each cell receives one of the plurality of first driving signals, one of the plurality of display signals, and one of the plurality of second driving signals, and each cell comprises:

a micro LED disposed on the common substrate; and a photo sensor disposed on the common substrate and configured to detect light and generate a sensing signal according to the detect light, wherein the micro LED comprises a light-emitting layer which is formed on a first semiconductor layer, wherein the photo sensor formed in a second semiconductor layer, and the second semiconductor layer is formed above the first semiconductor layer, and wherein the first semiconductor layer is proximate from the common substrate, and the second semiconductor layer is distal from the common substrate, a readout circuit coupled to the micro LED display panel and configured to generate an output signal according to the sensing signals; and a controller configured to control the first gate driver, the source driver, and the second gate driver and perform a fingerprint determination operation according to the output signal, wherein the photo sensors operate to detect ambient light of the micro LED display panel, and wherein when at least one of the micro LEDs is driven according to the detected ambient light, the at least one micro LED emits light to a finger of a user, at least one of the photo sensors generates the corresponding sensing signal according to reflected light from the finger, and the controller performs the fingerprint determination operation according to the output signal to detect a fingerprint of the finger.

7. The micro LED display device as claimed in claim 6, wherein the micro LED display panel further comprises:

a cover glass disposed on the driving layer;

a light guide layer disposed between the cover glass and the driving layer, wherein the light guide layer comprises a plurality of light guide plates which are disposed above the photo sensors of the cells respectively.

8. The micro LED display device as claimed in claim 6, wherein the driving layer further comprises:

a first transistor configured to transmit the corresponding display signal to the micro LED, wherein the first transistor comprises a metal layer, a gate insulation layer, an active layer, a first electrode layer, wherein the first semiconductor layer is formed on the first electrode layer.

9. The micro LED display device as claimed in claim 8, wherein the driving layer further comprises:

a transparent film formed above the micro LED and the first transistor; and a second transistor formed on the transparent film and coupled to the photo sensor, wherein the second transistor comprises a metal layer, a gate insulation layer, an active layer, a second electrode layer, wherein the second semiconductor layer is formed on the second electrode layer.

10. The micro LED display device as claimed in claim 6, wherein for each cell, the micro LED is configured to receive the corresponding display signal and emit light according to the corresponding display signal.

11. A fingerprint identification method for a micro light-emitting diode (LED) display panel comprising a plurality of cells, each cell comprising a micro LED and a photo sensor, the fingerprint identification method comprising:

detecting ambient light of the micro LED display panel by the photo sensor to generate sensing signals, wherein the photo sensors are disposed on a common substrate;

determining that a finger is approaching a region of the micro LED display panel in response to the sensing signals;

driving the micro LEDs of the cells in the region of the micro LED display panel to emit light, wherein the micro LEDs are disposed on the common substrate;

obtaining a fingerprint of the finger in response to light emitted by the micro LEDs; and determining whether the obtained fingerprint matches a predetermined pattern, wherein the micro LED comprises a light-emitting layer which is formed on a first semiconductor layer, wherein the photo sensor is formed in a second semiconductor layer, and the second semiconductor layer is formed above the first semiconductor layer, and wherein the first semiconductor layer is proximate from the common substrate, and the second semiconductor layer is distal from the common substrate.

12. The fingerprint identification method as claimed in claim 11, further comprising: in response to the obtained fingerprint matching the predetermined pattern, performing a specific function.

* * * * *